United States Patent
Li et al.

(10) Patent No.: US 9,136,178 B2
(45) Date of Patent: Sep. 15, 2015

(54) METHOD FOR FABRICATING A FINFET IN A LARGE SCALE INTEGRATED CIRCUIT

(75) Inventors: Ming Li, Beijing (CN); Ru Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/877,763

(22) PCT Filed: May 2, 2012

(86) PCT No.: PCT/CN2012/074965
§ 371 (c)(1),
(2), (4) Date: Apr. 4, 2013

(87) PCT Pub. No.: WO2013/152535
PCT Pub. Date: Oct. 17, 2013

(65) Prior Publication Data
US 2015/0024561 A1    Jan. 22, 2015

(30) Foreign Application Priority Data
Apr. 9, 2012 (CN) .......................... 2012 1 0102518

(51) Int. Cl.
*H01L 21/8238* (2006.01)
*H01L 21/8234* (2006.01)
(Continued)

(52) U.S. Cl.
CPC .. *H01L 21/823456* (2013.01); *H01L 21/28123* (2013.01); *H01L 21/823431* (2013.01);
(Continued)

(58) Field of Classification Search
CPC ....... H01S 5/227; H01S 5/2275; B82Y 20/00; B82Y 10/00; H01L 33/0062; H01L 21/0262; H01L 21/2018; H01L 21/823807; H01L 21/823878; H01L 21/76224; H01L 21/823814; H01L 27/0928; H01L 27/0922; H01L 27/1214; H01L 51/0545; H01L 27/12; H01L 51/0541
USPC ................... 438/222, 226, 142, 41, 300, 341, 438/FOR. 163, FOR. 190, FOR. 192, 438/FOR. 423, FOR. 424; 257/E33.005, 257/E21.09, E21.115, E51.005
See application file for complete search history.

(56) References Cited

U.S. PATENT DOCUMENTS 6,656,824 B1    12/2003    Hanafi et al.
7,041,601 B1    5/2006    Yu
(Continued)

FOREIGN PATENT DOCUMENTS

CN    202003995    10/2001
CN    1499588 A    5/2004
(Continued)

OTHER PUBLICATIONS

First Office Action for CN 201210102518.7 dated Mar. 3, 2014, 5 pgs.
(Continued)

*Primary Examiner* — Thao X Le
*Assistant Examiner* — Nduka Ojeh
(74) *Attorney, Agent, or Firm* — DLA Piper LLP (US)

(57) ABSTRACT

Systems and methods of fabricating a FinFET in large scale integrated circuit are disclosed. One illustrative method relates to a dummy gate process, wherein the fin structure is only formed in the gate electrode region by performing a photolithography process and an etching of a first dummy gate on a flat STI surface using chemical mechanical polishing, forming drain and source regions, depositing a medium dielectric layer, polishing the medium dielectric layer till the top of the first dummy gate is exposed through the chemical mechanical polishing process again, removing the dummy gate material via a dry etching and a wet etching, and continuously etching the STI dielectric layer with the hard mask formed by the medium dielectric layer, thereafter performing the deposition of real gate dielectric and gate electrode material to complete the device structure.

20 Claims, 6 Drawing Sheets

(51) Int. Cl.
*H01L 21/28* (2006.01)
*H01L 29/417* (2006.01)
*H01L 29/66* (2006.01)
*H01L 29/165* (2006.01)
*H01L 29/78* (2006.01)
*H01L 21/265* (2006.01)

(52) U.S. Cl.
CPC ...... *H01L21/823481* (2013.01); *H01L 29/165* (2013.01); *H01L 29/41783* (2013.01); *H01L 29/6681* (2013.01); *H01L 29/66545* (2013.01); *H01L 29/66628* (2013.01); *H01L 29/66795* (2013.01); *H01L 29/66818* (2013.01); *H01L 29/785* (2013.01); *H01L 21/2652* (2013.01); *H01L 21/26506* (2013.01); *H01L 21/26586* (2013.01)

(56) References Cited

U.S. PATENT DOCUMENTS

| | | | |
|---|---|---|---|
| 7,479,684 | B2 | 1/2009 | Guha et al. |
| 8,109,459 | B2 | 1/2012 | Chang et al. |
| 2006/0076625 | A1 | 4/2006 | Lee |
| 2006/0121688 | A1* | 6/2006 | Ko et al. ........................ 438/439 |
| 2006/0131666 | A1* | 6/2006 | Li et al. .......................... 257/387 |
| 2008/0242039 | A1* | 10/2008 | Ku et al. ....................... 438/305 |
| 2009/0101978 | A1* | 4/2009 | Anderson et al. ............. 257/365 |
| 2009/0152618 | A1* | 6/2009 | Matsuo et al. ................. 257/324 |
| 2009/0206400 | A1 | 8/2009 | Juengling |
| 2009/0275214 | A1* | 11/2009 | Surthi ........................... 438/787 |
| 2010/0144110 | A1* | 6/2010 | Wang et al. ................... 438/305 |
| 2011/0097889 | A1 | 4/2011 | Yuan et al. |
| 2011/0147812 | A1* | 6/2011 | Steigerwald et al. ......... 257/288 |
| 2011/0284966 | A1* | 11/2011 | Wen et al. ..................... 257/368 |

FOREIGN PATENT DOCUMENTS

| | | |
|---|---|---|
| CN | 1645629 A | 7/2005 |
| CN | 1770470 | 5/2006 |
| CN | 1790742 A | 6/2006 |
| CN | 101093805 | 12/2007 |
| CN | 101577278 A | 11/2009 |
| CN | 102194755 A | 9/2011 |
| CN | 102386085 | 3/2012 |
| EP | 1 555 688 B1 | 11/2009 |

OTHER PUBLICATIONS

English Language Abstract of CN 1770470 published May 6, 2010.
English Language Abstract of CN 102386085 published Mar. 21, 2012.
English Language Abstract of CN 101093805 published Dec. 26, 2007.
International Search Report issued in PCT/CN2012/074968 on Jan. 24, 2013.

* cited by examiner

METHOD FOR FABRICATING A FINFET IN A LARGE SCALE INTEGRATED CIRCUIT

CROSS REFERENCE TO RELATED APPLICATIONS

This application is a U.S. National Stage Application of International Application No. PCT/CN2012/074965 filed May 5, 2012, which claims the priority of the Chinese Patent Application No. 201210102518.7, filed on Apr. 9, 2012. The entirety of all the above-listed applications are incorporated herein by reference in their entirety.

FIELD OF THE INVENTION

The invention relates to a fabrication of large scale semiconductor integrated circuit, more particularly, to a device integration process in the large scale integrated circuit.

BACKGROUND OF THE INVENTION

As Moore law proceeds to the technical node of 22 nm, the traditional planar field effect transistor can not meet the requirements of low power consumption and high performance. In order to overcome the short channel effect and improve the drive current density, field effect transistors with a fin-shaped channel (FinFET) of 3-dimensional structure has been introduced into the large scale integrated circuits. This structure has very excellent immunity to short channel effect and very high drive current owing to the large gate-controlling area and narrow channel depletion region.

There are many challenges in FinFET fabrication to limit the applications of FinFET in large scale integrated circuits. One of the difficulties lies in the etching of the 3-dimesional gate profile, which is due to the surface fluctuation occurred when depositing gate materials. The gate materials have large surface fluctuation since they are deposited on 3-dimensional fin-shaped silicon strips. Thus, it is difficult to focus during the lithography process and it is difficult to completely remove the gate materials on sidewalls of the fin unless using a large over-etching process. However, the large over-etching process may cause damage to the silicon active region. This problem is serious especially when employing a high resolution lithography process below 22 nm. Hence, the product yield is restricted.

Several methods have been proposed to perform a planarization process firstly, and then to perform a photolithgraphy process and an etching process. For example, it is disclosed in U.S. patent publication US2005056845-A1 that an entire planar gate material is obtained by covering the fin with two gate layers of different materials, and then performing a planarization process to the first gate layer through a chemical mechanical polishing method. This method requires firstly covering the top of the fin with a layer of insulation dielectric to protect the top of the fin from damage. However, this method can neither form triple gate structure nor reduce the burden of the gate etching process.

The problem caused by the gate etching residue on sidewalls is solved in U.S. patent publication US2005170593-A1 by Damascus fake-gate process, that is, by etching the trench with a gate electrode mask and then refilling the gate material, which may address the problem caused by the gate etching residue on fin sidewalls. Thus, the reliability of product is improved. However, this method can not form the triple gate structure, and the gate strip width on the top of the fin and the gate strip width on sidewalls can not be formed in a self-aligned manner.

SUMMARY OF THE INVENTION

In order to solve the above problems in the fabrication of 3-dimensional triple gate FinFET structure on bulk silicon, the present invention proposes a gate-last integration process based on the planarization process, which is suitable for the large scale integrated circuit. According to embodiments of the present invention, a flat gate surface is obtained and the problem of gate etching residue on fin sidewalls is avoided. In addition, according to embodiments of the present invention, the high-K metal gate process may be effectively integrated; the increase of equivalent oxide thickness and the work function drift are avoided, so that an excellent device performance may be obtained.

The method according to an embodiment of the present invention may include the following steps:

1) forming a STI isolation layer on a bulk silicon substrate, and performing a well implantation and a channel ion implantation to the active region and performing an annealing process;

2) exposing the silicon surface of the active region, depositing a sacrificial gate oxide layer, forming a dummy gate on the sacrificial oxide layer, wherein the top of the dummy gate is covered by a composite hard mask including silicon oxide and silicon nitride;

3) removing the sacrificial oxide layer covered on the drain and source regions, depositing a thin film of silicon nitride as an implantation mask for the drain and source regions to perform a drain and source LDD implantation and Halo implantation, and performing a rapid flash annealing of milliseconds;

4) depositing a silicon nitride layer, performing a photolithgraphy process, performing an anisotropic dry etching process to the silicon nitride layer with the photoresist as a mask, to form silicon nitride spacers of the dummy gate and expose the drain and source regions, and then performing an etch-back process to the STI isolation layer around the silicon mesa of the drain and source regions;

5) removing the photoresist, performing a drain and source epitaxial growth on the exposed source and drain, and then performing an additional drain and source implantation and flash annealing of millisecond to activate the drain and source dopant;

6) depositing a silicon oxide layer so as to cover the entire surface of silicon wafer; then performing a thinning and planarization of the silicon oxide layer through a chemical mechanical polishing process with the silicon nitride layer on the top of the dummy gate as a stop layer; then performing a dry etch-back process to the silicon oxide layer, till ⅓-½ of the height of the dummy gate;

7) depositing a silicon nitride layer, performing a thinning process to the silicon nitride layer through a chemical mechanical polishing process till the silicon oxide layer on top of the dummy gate or the polysilicon dummy gate is exposed; with the remaining silicon nitride layer as a hard mask, removing the polysilicon to expose the STI oxide layer under the dummy gate; performing a dry etch-back process to this portion of the STI oxide layer to form fin-shaped channel region;

8) wet etching the remaining silicon oxide layer on the top and sides of the fin-shaped channel region, depositing the gate dielectric and gate electrode material to complete the device structure.

During implementation of the present invention, the following specific operations may be taken.

In Step 1), a silicon oxide layer is grown and a silicon nitride layer is deposited on the bulk silicon substrate, the pattern of active region is transferred onto the silicon nitride layer by the lithography process, the silicon nitride layer is etched with the photoresist as a mask, and the silicon oxide layer and the bulk silicon is dry-etched with the silicon nitride layer as a hard mask to form a shallow trench, the depth of the shallow trench being within the range of 1000 Å-3000 Å; the shallow trench is filled through a high aspect ratio silicon oxide deposition process and a silicon oxide layer covers the entire silicon surface; the surface of the silicon oxide layer is planarized through the chemical mechanical polishing process till the hard mask layer of silicon nitride is expoesd, to form the STI isolation layer.

After forming the STI isolation layer in step 1), the etching process and implantation for the well are performed, then the silicon nitride hard mask layer on the active region is removed, and the channel ion implantation is performed.

In step 2), the dummy gate may be formed by: depositing a thin layer of silicon oxide on the exposed surface of the active region as a sacrificial gate oxide layer through an atomic layer deposition (ALD) process, then depositing a layer of polysilicon or amorphous silicon on the sacrificial gate oxide layer as the dummy gate material, and sequentially depositing a silicon oxide layer and a silicon nitride layer as a hard mask; then performing a gate patterning with the photoresist as a mask to etch the silicon nitride layer on the top; and, removing the photoresist and performing the dry etching process to the silicon oxide layer and the gate layer with the silicon nitride layer on the top after etching as a hard mask, to eventually stop on the sacrificial gate oxide layer.

In step 3), the energy of LDD implantation is 500 eV-5 KeV, the implantation dose is $1E14$ $cm^{-3}$-$2E15$ $cm^{-3}$, the implantation angle is 0-7 degrees, and the LDD implantation impurity may be P and/or As for N-type transistor and be B and the compound thereof for P-type transistor. For both types of transistors, Ge or C implantation may be selected as pre-amorphization implantation. The energy of Halo implantation is 1 KeV-45 KeV, the implantation dose is $1E12$ $cm^{-3}$-$1E14$ $cm^{-3}$, the implantation angle is 15-30 degrees, and the Halo implantation impurity may be B and the compound thereof for N-type transistor and be P and/or As for P-type transistor. For both types of transistors, Ge or C implantation may be selected as the pre-amorphization implantation.

In step 4), the etch-back depth of the STI isolation layer around the drain and source regions is 100 Å-2000 Å. The etching condition with high selectivity of silicon oxide to silicon is employed when the etch-back process is performed to the STI isolation layer.

In step 5), SiGe material is epitaxially grown on the drain and source of P-type transistor; and Si or SiC material is epitaxially grown on the drain and source of N-type transistor. The epitaxial thickness in the direction of the fin width typically does not exceed ⅓ of the spacing distance of two fins adjacent to each other in the integrated circuit.

In step 6), the silicon oxide deposition is performed through the high density plasma chemical vapor deposition (HDP CVD) so as to cover the entire surface of silicon wafer, and then the thinning, planarization, and etch-back process are performed.

In step 7), the dummy gate is removed by performing the dry etch process firstly and then the dummy gate is removed completely through the wet etch process.

In step 7), the STI isolation layer under the dummy gate is etched back, the etch-back depth being 100 Å-2500 Å. As same as step 4), an etching condition with high selectivity of silicon oxide to silicon is high is employed during the etching process.

In step 8), the deposition of the high-K dielectric and metal gate electrode is performed, and the thinning and planarization of the metal gate are then performed through the chemical mechanical polishing process to stop on the silicon nitride layer, thereby resulting in 3-dimensional triple gate FinFET device.

After step 8), the back-end process of transistors are performanced, including contact hole etching, metal deposition, forming metal electrode and interconnection wire.

The inventive concept of the present invention lies in that the fin structure is only formed in the gate electrode region as following: performing the photolithgraphy process and the first etching of the dummy gate on the flat surface formed by the STI chemical mechanical polishing process, forming the drain and source region, depositing a medium dielectric layer, polishing the medium dielectric layer till the top of the dummy gate is exposed, removing the dummy gate material by the dry etch process and the wet etch process, and continuously etching the STI dielectric layer with the hard mask formed of the medium dielectric layer to form the Fin structure only in the gate electrode region. After that, the true gate dielectric and gate electrode material are deposited to complete the device structure.

The present invention has following advantages: (1) the surface of the gate is flat, meeting the flatness requirements for the photolithgraphy below 22 nm; (2) the etching amount of the dummy gate is small to enable forming a steep and straight pattern, whereby reducing the limitation on gate pitch and the influence of parasitical capacitance; (3) the fin structure is only formed in the gate region so as to avoid the gate material remaining on sidewalls of drain and source, thus improving the isolation reliability of the device; (4) the 3-dimensional high-K metal gate structure can be achieved with the dummy gate process to improve the threshold control capability of FinFET; (5) the method of embodiments of the present invention is completely compatible with the process of bulk silicon planar transistor and the processing cost is low.

DETAILED DESCRIPTION OF EMBODIMENTS

The present invention can be implemented through following specific embodiments, however, is not limited to the process parameters range mentioned in the embodiments, and similar inventive spirit shall be regarded as the extension of the present invention.

A FinFET device is fabricated by following steps.

1. A silicon oxide layer and a silicon nitride layer are deposited on a bulk silicon substrate 101 along the crystal orientation of (100) or (110) as a hard mask for the first etching, wherein the thickness of the silicon oxide layer 102 is 50 Å-200 Å, and the thickness of the silicon nitride layer 103 is 70 Å-500 Å.

2. A pattern of the active region is transferred to the silicon nitride layer 103 with the mask for the first lithography process, and the photoresist is used as a hard mask to etch the silicon nitride layer, and this etching is stopped on the silicon oxide layer 102.

Figure 1:
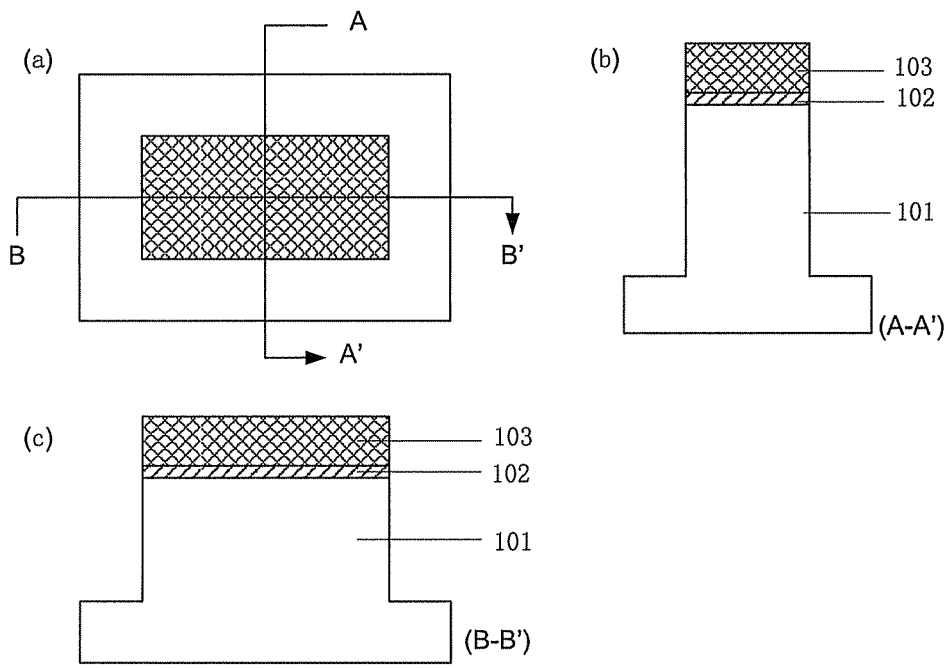
FIG. 1 is a schematic diagram of a device structure after performing a silicon active region etching of step 3 according to an embodiment, wherein (a) is a top view, (b) is a cross sectional view taken in direction A-A', and (c) is a cross sectional view taken in direction B-B'.

3. The photoresist is removed, and the silicon oxide layer and the bulk silicon are etched with the silicon nitride layer as a hard mask to form a shallow trench. As shown in FIG. 1, the depth of the shallow trench is 1000 Å-3000 Å, the angle between the ramp and the silicon surface is 80-90 degrees. After the etching is completed, the depth of remaining silicon nitride hard mask 103 is 50 Å-300 Å.

4. The corners of the silicon active region obtained by etching are rounded through an in-situ steam generated oxidation, and the thickness of the generated silicon oxide layer is 10 Å-50 Å.

5. The remaining silicon trench is refilled through a silicon oxide deposition process with a high aspect ratio, the refilling thickness being 3000 Å-7000 Å, and the refilled silicon oxide covers the entire silicon surface.

Figure 2:
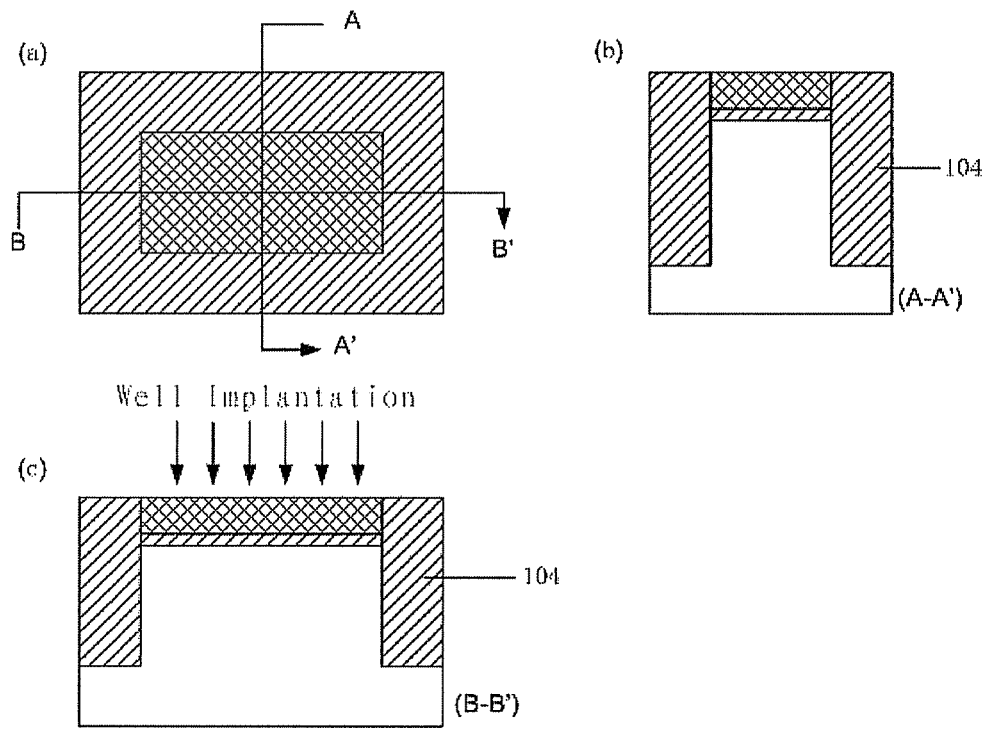
FIG. 2 is a schematic diagram of a device structure when performing the well implantation after the STI filling and CMP of steps 6 and 7 according to an embodiment, wherein (a) is a top view, (b) is a cross sectional view in direction A-A', and (c) is a cross sectional view taken in direction B-B'.

6. The surface of the silicon oxide layer is planarized through the chemical mechanical polishing process, and the silicon oxide layer is thinned till the silicon nitride hard mask layer is exposed, to form a structure in which the active region of the device is surrounded by the silicon oxide layer and the active region is covered with the silicon nitride layer. This silicon oxide region is referred to STI isolation layer 104, as shown in FIG. 2.

7. The photolithograph process and implantation process are performed to the well (see FIG. 2).

Figure 3:
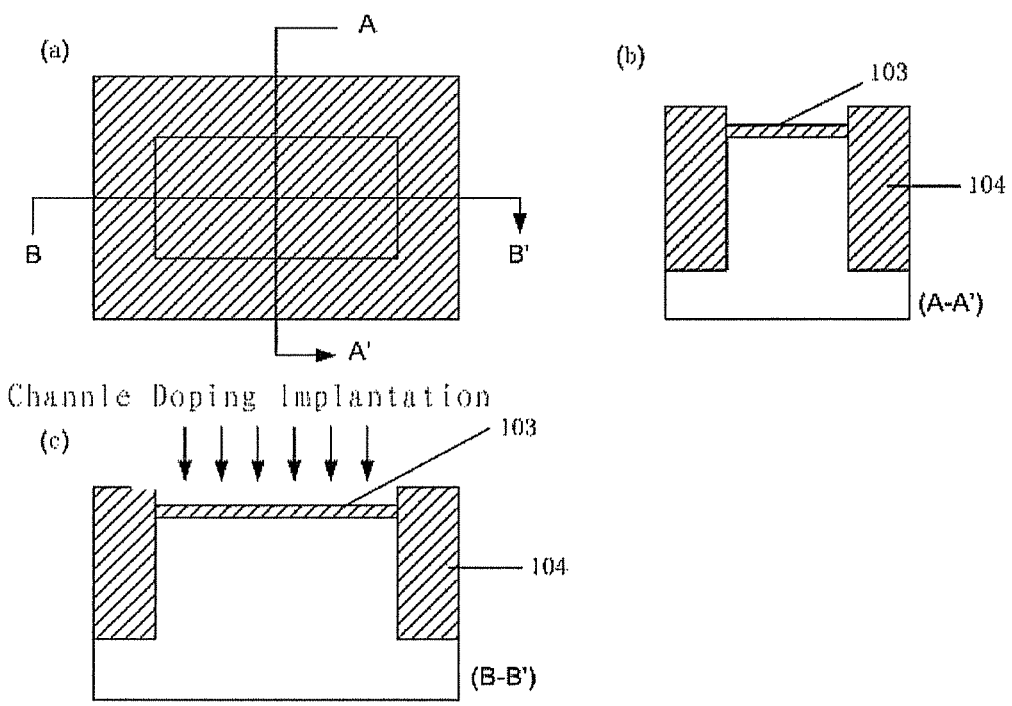
FIG. 3 is a schematic diagram of a device structure when removing the silicon nitride hard mask and performing channel doping implantation of steps 8 and 9 according to an embodiment, wherein (a) is a top view, and (b) and (c) are cross sectional views taken along A-A' and B-B', respectively.

8. The STI isolation layer 104 is etched back with a diluted hydrofluoric acid solution (DHF), the amount of etch-back is obtained by subtracting about 30 Å from the thickness of the silicon nitride hard mask. Then, the silicon nitride layer 103 is removed with a hot phosphoric acid, as shown in FIG. 3.

9. The channel doping ion implantation is performed (see FIG. 3).

10. The mask for the ion implantation is removed, and the thermal annealing is performed by the RTA process, the annealing temperature being 1000° C.-1100° C., the annealing time is 10 seconds-1 hour. After annealing, the impurity implanted via the well implantation and the channel implantation are activated and diffused evenly into the active region.

Figure 4:
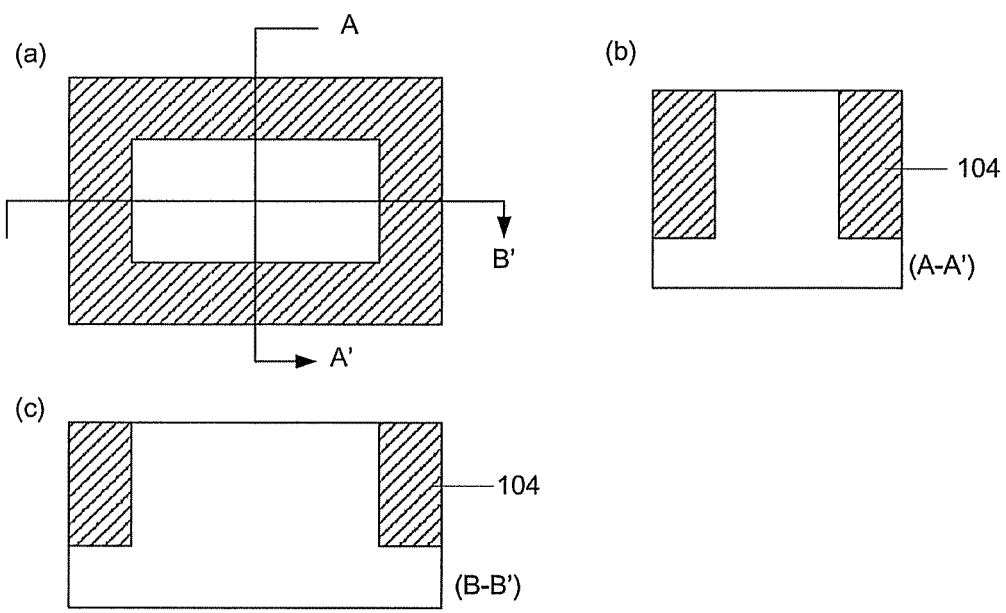
FIG. 4 is a schematic diagram of a device structure when exposing the silicon surface of the active region of step 11 according to an embodiment, wherein (a) is a top view, and (b) and (c) are cross sectional views taken along A-A' and B-B', respectively.

11. The thermal oxide layer on the top of the active region is removed with DHF and the silicon oxide layer 104 which is used as the STI isolation layer is etched back, so that the silicon surface of the active region is exposed and keeps a smaller step (or recess) with the STI region, as shown in FIG. 4. The height difference between the steps is smaller than 50 Å.

12. A thin layer of silicon oxide is deposited as a sacrificial oxide layer 105 through the atomic layer deposition (ALD) process, the deposition thickness being 15 Å-30 Å, on which a layer of polysilicon or amorphous silicon is deposited as dummy gate. The thickness of the dummy gate 106 is 500 Å-1500 Å. A Silicon oxide layer 107 with a thickness of 100 Å-200 Å and a silicon nitride layer 108 with a thickness of 300 Å-800 Å are sequentially deposited on the dummy gate 106 as a hard mask.

13. The lithography process is performed to form the gate pattern, and the top silicon nitride 108 is etched with the photoresist as a mask.

Figure 5:
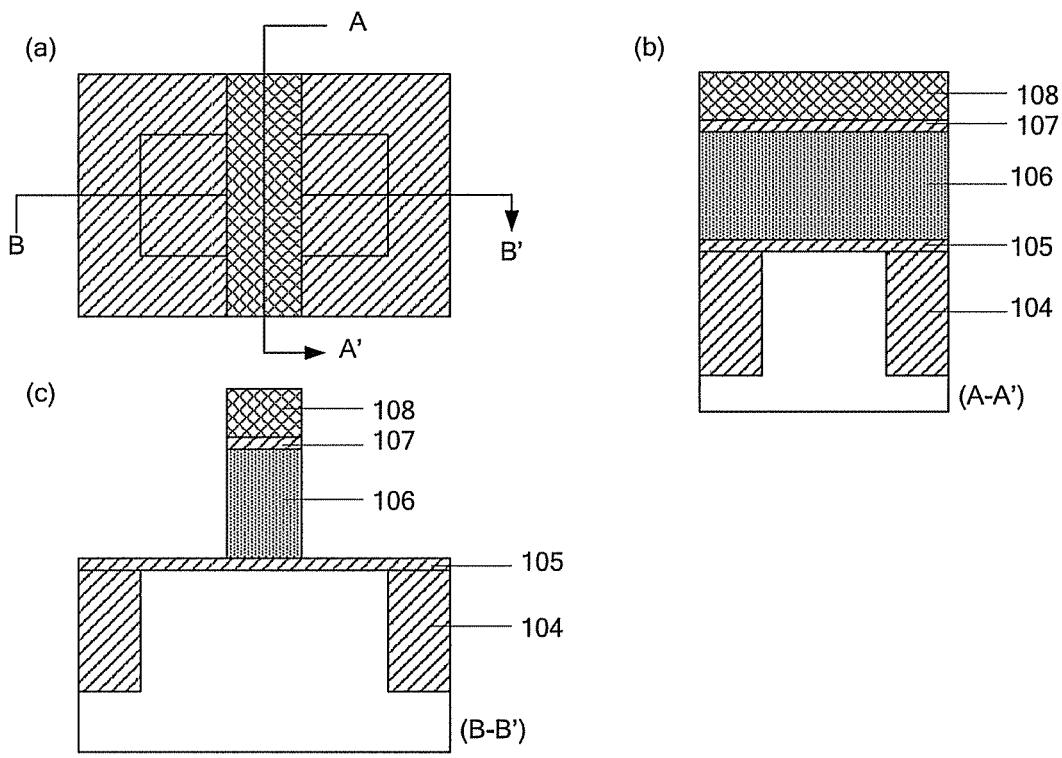
FIG. 5 is a schematic diagram of a device structure after performing polysilicon gate etching of step 14 according to an embodiment, wherein (a) is a top view, and (b) and (c) are cross sectional views taken along A-A' and B-B', respectively, and a composite hard mask of silicon oxide and silicon nitride is located on top of the polysilicon gate.

14. After removing the photoresist, a dry etching process is performed to the silicon oxide layer 107 and the polysilicon dummy gate 106 with the silicon nitride layer 108 as a hard mask, and the thy etching process stops on the sacrificial gate oxide layer 105, as shown in FIG. 5.

Figure 6:
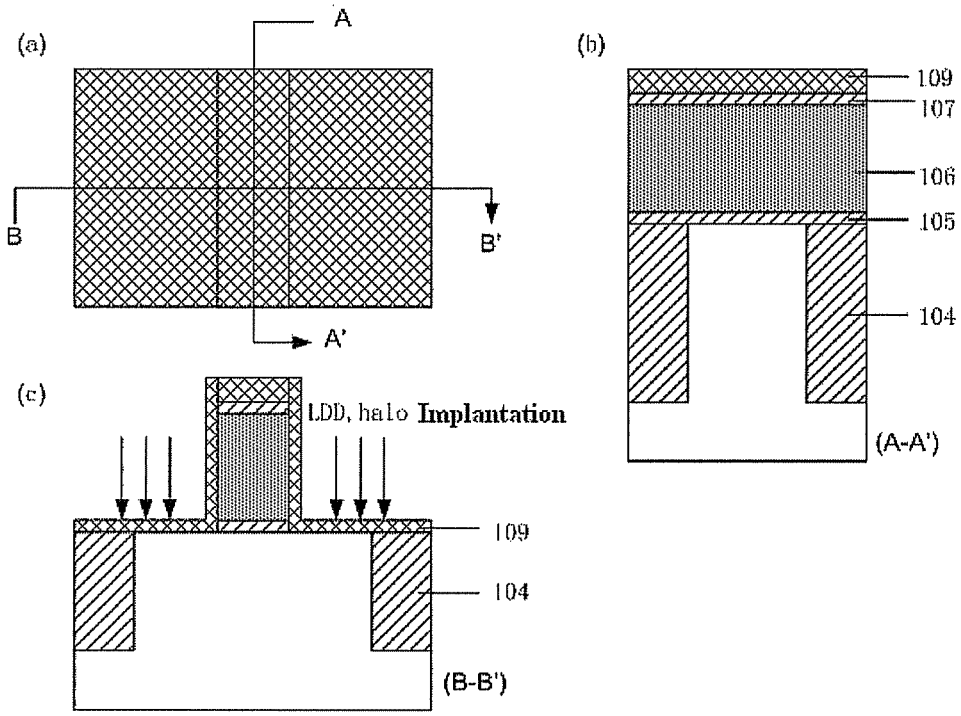
FIG. 6 is a schematic diagram of a device structure when performing LDD and Halo implantations of step 16 according to an embodiment, wherein (a) is a top view, and (b) and (c) are cross sectional views taken along A-A' and B-B', respectively, and the gate, the active region and the STI region are covered with a silicon nitride layer which is used as an implantation screening layer.

15. The sacrificial gate oxide layer 105 covering the drain and source regions is removed with DHF, and the thin silicon nitride layer 109 deposited through the ALD process is used as a LDD and Halo implantation mask for the drain and source, the thickness of the layer 109 being about 10 Å-30 Å, as shown in FIG. 6.

16. The LDD and Halo implantation is performed via the thin silicon nitride layer 109 covering the drain and source (see FIG. 6), wherein the energy of the LDD implantation being 500 eV-5 KeV, the dose being 1E14 cm$^{-3}$-2E15 cm$^{-3}$, the implantation tilt angle is 0-7 degrees, and the LDD implantation impurity may be P and/or As for N-type transistor and be B and the compound thereof for P-type transistor. For both type transistors, Ge or C implantation may be selected as a pre-amorphization implantation. The energy of the Halo implantation may be 1 KeV-45 KeV, the implantation dose may be 1E12 cm$^{-3}$-1E14 cm$^{-3}$, the implantation tilt angle may be 15-30 degrees, and the Halo implantation impurity may be B and the compound thereof for N-type transistor and P and/or As for P-type transistor. For both type transistors, the Ge or C implantation may be selected as the pre-amorphization implantation.

17. The annealing is implemented through a rapid flash annealing of milliseconds (flash RTP), to completely activate the impurity, cure implantation defects to avoid the enhanced diffusion, the annealing peak temperature being 900° C.-1050° C. and the annealing time being 0.1 ms-10 ms.

18. A silicon nitride layer is deposited through the ALD process, the deposition thickness being 50 Å-150 Å, and a lithography process is performed and the silicon nitride sidewalls 110 are formed through the anisotropic dry etching process, to expose the silicon surface of the drain and source regions. After etching, the thickness of the silicon nitride layer remaining on the top of the dummy gate may be about 200 Å, and the lost amount of the silicon surface may not exceed 30 Å.

Figure 7:
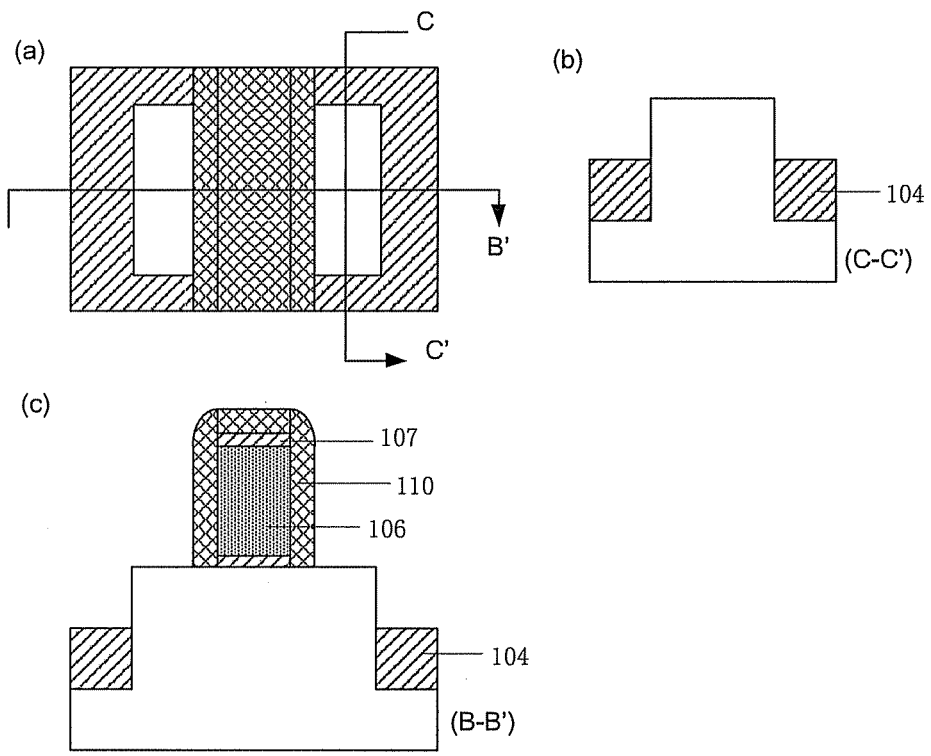
FIG. 7 is a schematic diagram of a device structure when performing the first etch-back to the STI silicon oxide layer around the drain and source after forming the silicon nitride spacers of step 19 according to an embodiment, wherein (a) is a top view, and (b) and (c) are cross sectional views taken along C-C' and B-B', respectively.

19. A STI silicon oxide etching process is performed with the photoresist and the silicon nitride layer (the silicon nitride layer remaining on the top of dummy gate and the silicon nitride sidewalls on both sides of the dummy gate) as a mask, so that the silicon oxide layer 104 around the silicon mesa of the drain and source regions forms an etch-back portion, the depth thereof being 100 Å-2000 Å, as shown in FIG. 7.

Figure 8:
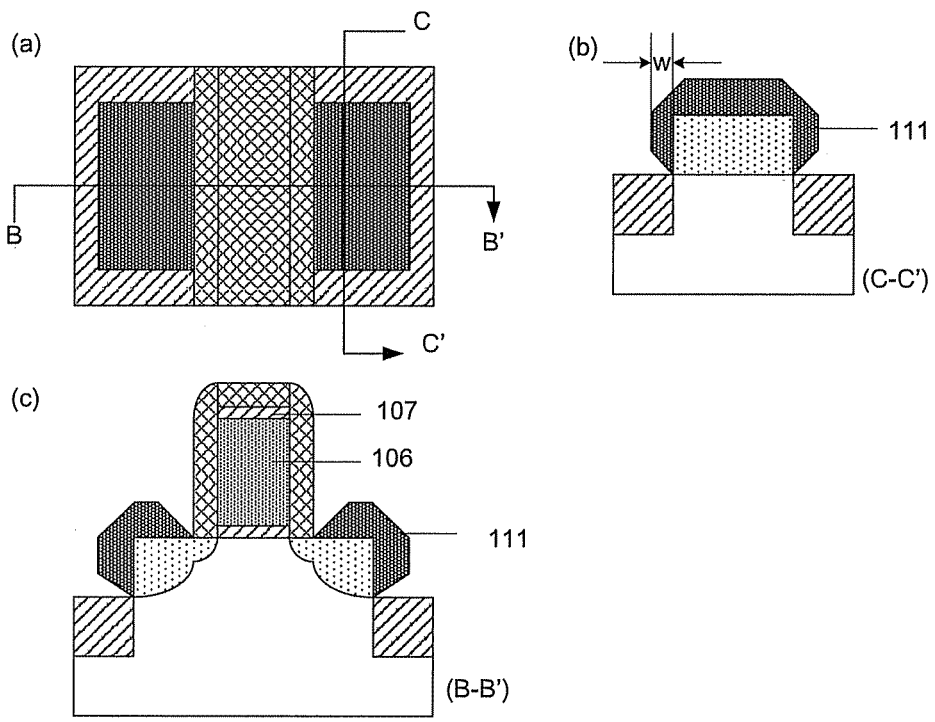
FIG. 8 is a schematic diagram of a device structure after performing drain and source epitaxial growth and additional implantation of steps 20 and 21 according to an embodiment, wherein (a) is a top view, and (b) and (c) are cross sectional views taken along C-C' and B-B', respectively, and the region denoted by spots in the drain and source is a metallurgical junction formed by an in-situ impurity out-diffusion during the drain and source epitaxial growth.

20. After removing the photoresist, the drain and source 111 are raised through a selective epitaxial growth with the exposed silicon mesa as a crystal seed window (as shown in FIG. 8). As for the P-type transistor, SiGe material is grown with the growth amount being 100 Å-500 Å, the content of Ge being 30%-50%, the in-situ B doping amount being 1E19 cm$^{-3}$-1E21 cm$^{-3}$. As for the N-type transistor, Si or SiC material is grown, with the growth amount being 100 Å-500 Å, the in-situ P doping amount being 1E19 cm$^{-3}$-1E21 cm$^{-3}$. The epitaxial thickness in the direction of the fin width (shown in FIG. 8 as W) typically does not exceed ⅓ of the spacing distance of two fins adjacent to each other in integrated circuit.

21. After the lithography process, the N+ or P+ doped region is exposed and then an additional implantation for the drain and source is performed. As for the N-type transistor, Ge and C are firstly implanted, and thereafter As and/or P are implanted, the implantation energy and dose for those are: Ge: 15 KeV-35 KeV, dose: 1E14 cm$^{-3}$-1E15 cm$^{-3}$; C: 5 K-20 K, dose: 1E13 cm$^{-3}$~1E15 cm$^{-3}$; As: 5 K-20 K, dose: 1E15 cm$^{-3}$-1E16 cm$^{-3}$; and P: 10 K-30 K, dose: 1E13 cm$^{-3}$~1E15 cm$^{-3}$. As for the P-type transistor, Ge is firstly implanted, and thereafter B is implanted, the implantation energy and dose for those are: Ge: 15 KeV-35 KeV, dose: 1E14 cm$^{-3}$~1E15 cm$^{-3}$; and B: 0.5 KeV-20 KeV, dose: 5E12 cm$^{-3}$~1E15 cm$^{-3}$.

22. After the implantation, the annealing is implemented through the flash annealing of milliseconds, the annealing peak temperature being 900° C.-1050° C., and the annealing time being 0.1 ms-10 ms.

23. A silicon oxide layer is deposited through a high density plasma chemical vapor deposition (HDP CVD), to cover the entire surface of the silicon wafer and to remove all cavities therein, the deposition thickness being about 1000 Å-3000 Å.

24. The silicon oxide layer is thinned and planarized through the chemical mechanical polishing process, with the silicon nitride layer remaining on the top of the dummy gate as a stop layer.

25. The silicon oxide layer is etch-backed to ⅓-½ of the height of the dummy gate through a dry etching process.

26. A silicon nitride layer is deposited, the deposition thickness being 300 Å-500 Å.

Figure 9:
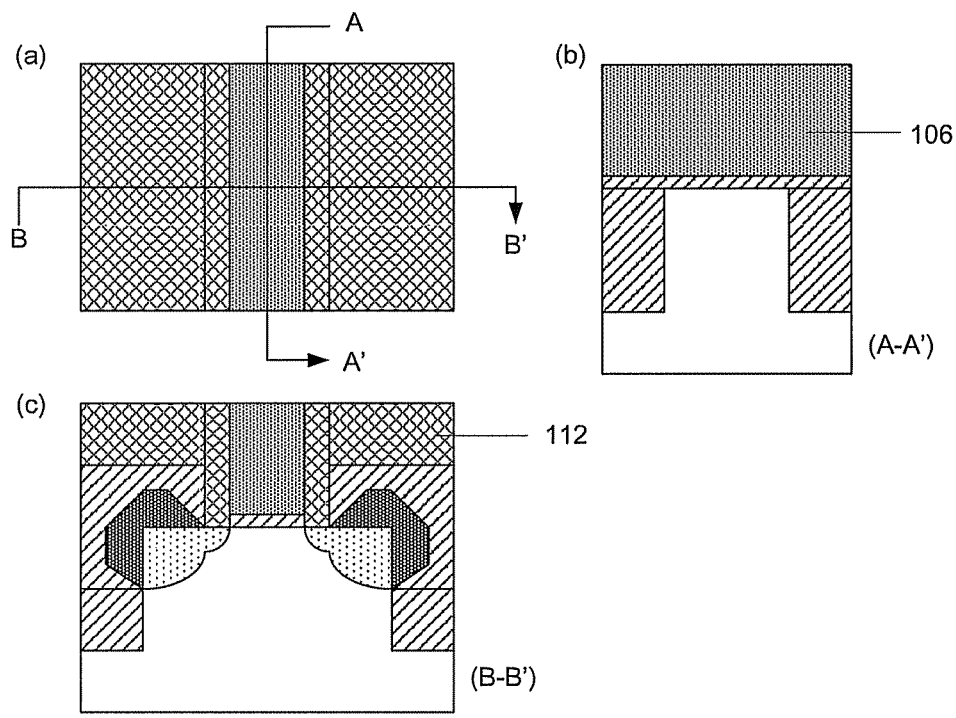
FIG. 9 is a schematic diagram of a device structure after performing silicon oxide and silicon nitride refilling and CMP to remove the silicon nitride and silicon oxide layers on top of the polysilicon dummy gate of step 27 according to an embodiment, wherein (a) is a top view, and (b) and (c) are cross sectional views taken along A-A' and B-B', respectively.

27. The silicon nitride layer is thinned through the chemical mechanical polishing process, which stops on the silicon oxide layer 107 on the top of the dummy gate or on the dummy gate 106 with the thickness of the silicon nitride layer 112 remaining on both sides of the dummy gate is about 100 Å-200 Å, as shown in FIG. 9.

28. The dummy gate 106 is etch-backed to a remaining thickness of about 100 Å through dry etching, with the remaining silicon nitride layer 112 as a hard mask, and then the remaining dummy gate is stripped off with tetrabutyl ammonium hydroxide (TMAH) solution to expose the STI silicon oxide layer 104 of the isolation region.

Figure 10:
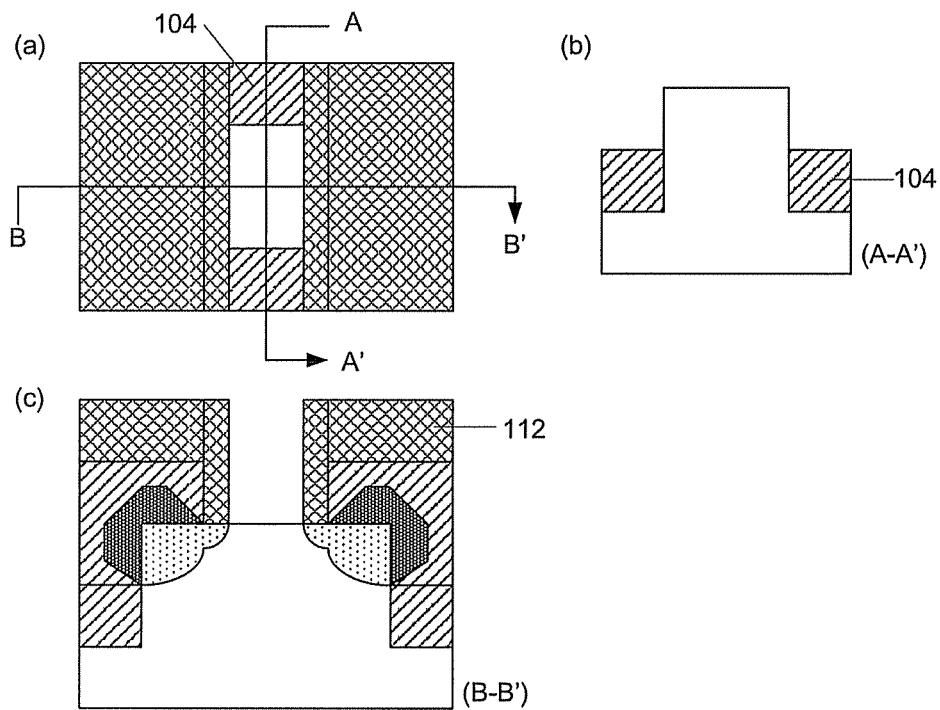
FIG. 10 is a schematic diagram of a device structure when performing the second etch-back to the STI layer to form partial fin structure after removing the polysilicon layer of step 29 according to an embodiment, wherein (a) is a top view, and (b) and (c) are cross sectional views taken along A-A' and B-B', respectively.

29. The STI silicon oxide layer 104 is etched through the dry etching process with the silicon nitride layer as a hard mask to form a fin-shaped channel region, the etching depth being 100 Å-2500 Å, as shown in FIG. 10.

Figure 11:
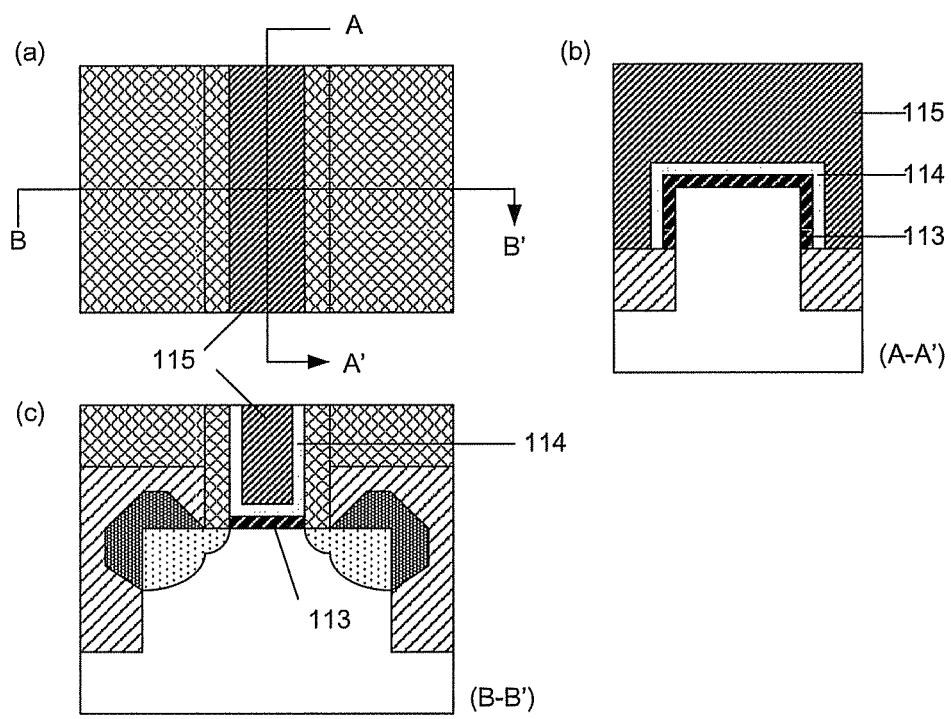
FIG. 11 is a schematic diagram of a device structure after re-growing high-K dielectric and metal gate material in the dummy gate region of step 30 according to an embodiment, wherein (a) is a top view, and (b) and (c) are cross sectional views taken along A-A' and B-B', respectively, and reference sign 113 refers to high-K gate dielectric, reference sign 114 refers to work function material, and reference sign 115 refers to Al material used as the filling material; as can be seen, the high-K dielectric and the metal gate cover on the fin in a shape of "Π", forming a triple gate control structure.

30. The silicon oxide layer remaining on the top and sidewalls of the fin-shaped channel region is removed with the DHF and a high-K dieletric deposition and the metal gate electrode deposition are performed. A thermal annealing is performed between the high-K dielectric deposition and the metal gate deposition in order to suppress interface dipoles and to recover interface traps. Specifically, the metal gate is formed by: depositing a layer of work function material on the high-K electric layer through the PVD, the deposition thickness being about 50 Å-100 Å; depositing a metal filling material (such as Al) through the PVD to fulfill the entire gate trench; and performing the thinning and planarization process which stops on the silicon nitride layer 112 to the filling material, work function material and high-K gate dielectric, whereby the metal gate is obtained, as shown in FIG. 11, wherein the work function material is located between the filling metal material 115 and the high-K gate dielectric 113.

31. The etching process for the contact holes is performed sequentially and the landing region of the etching process is located on the N+ and P+ raised drain and source 111. Then a Ni/Pt layer is deposited through the ALD process, and the annealing for metal silicide is performed through the flash RTP.

32. The sequential back-end processes are similar as those of current 45 nm and 32 nm copper interconnection processes, which are used to complete interconnection. The embodiments as described above are not intended to limit the present invention, and various alternations and modifications can be made to those embodiments by those skilled in the art without departing the spirit and scope of the present invention, therefore the scope of protection of the present invention is defined by the appended claims.

The invention claimed is:

1. A method for fabricating a FinFET, comprising the following steps:
   1) forming a STI isolation layer on a bulk silicon substrate, performing a well implantation and channel ion implantation to an active region and performing an annealing;
   2) exposing a silicon surface of the active region, depositing a sacrificial gate oxide layer, forming a dummy gate on the sacrificial gate oxide layer, wherein the top of the dummy gate is covered by a composite hard mask of silicon oxide and silicon nitride;

3) removing the sacrificial gate oxide layer covered on the drain and source regions, depositing a thin film of silicon nitride as an implantation mask for the drain and source regions to perform a drain and source LDD implantation and a Halo implantation, and performing a rapid flash annealing of milliseconds;

4) depositing a silicon nitride layer, performing a photolithography process, performing an anisotropic dry etching to the silicon nitride layer with a photoresist as a mask, to form silicon nitride sidewalls of the dummy gate and expose the silicon mesa of the drain and source regions, and then performing an etch-back process to the STI isolation layer around the silicon mesa of the drain and source regions;

5) removing the photoresist, performing a drain and source epitaxial growth with the exposed silicon mesa as a crystal seed window, and then performing an additional drain and source implantation and a flash annealing of millisecond to form the drain and source regions;

6) depositing a silicon oxide layer so as to cover the entire surface of silicon wafer; then performing a thinning and planarization of the silicon oxide layer through a chemical mechanical polishing process with the silicon nitride layer on the top of the dummy gate as a stop layer; then performing a dry etch-back to the silicon oxide layer till ⅓-½ of the height of the dummy gate;

7) depositing a silicon nitride layer, performing a thinning process to the silicon nitride layer by a chemical mechanical polishing process till the silicon oxide layer on top of the dummy gate or the dummy gate is exposed; with a remaining silicon nitride layer as a hard mask, removing the dummy gate to expose the STI isolation layer under the dummy gate; performing a dry etch-back process to the STI isolation layer to form the fin-shaped channel region; and 8) etching the silicon oxide layer remaining on the top and sidewalls of the fin-shaped channel region, depositing a real gate dielectric and gate electrode material to complete the device structure.

2. The method for fabricating the FinFET of claim 1, wherein, Step 1) comprising growing a silicon oxide layer and depositing a silicon nitride layer on the bulk silicon substrate, transferring a pattern of the active region onto the silicon nitride layer by the lithography process, etching the silicon nitride layer with the photoresist as a mask, and performing a dry etching to the silicon oxide layer and the bulk silicon with the silicon nitride layer as a hard mask to form a shallow trench, the depth of the shallow trench being within the range of 1000 Å-3000 Å; refilling the shallow trench through a high aspect ratio silicon oxide deposition process and covering an entire silicon surface with the silicon oxide layer; performing a planarization to the surface of the silicon oxide layer through a chemical mechanical polishing process, and performing a thinning process till the hard mask layer of silicon nitride is exposed, to form a STI isolation layer; performing the lithography process and the implantation process to a well, removing the silicon nitride hard mask layer, and performing a channel ion implantation.

3. The method for fabricating the FinFET of claim 1, wherein, step 2) comprising: depositing a thin layer of silicon oxide on an exposed surface of the active region as the sacrificial gate oxide layer by an atomic layer deposition (ALD) process, then depositing a layer of polysilicon or amorphous silicon on the sacrificial gate oxide layer as a dummy gate material, and sequentially depositing a silicon oxide layer and a silicon nitride layer as a hard mask; then performing a photolithography process for the gate pattern with the photoresist as a mask to etch the silicon nitride layer on the top; and, removing the photoresist and performing a dry etching to the silicon oxide layer and the dummy gate till the sacrificial gate oxide layer is exposed with an patterned silicon nitride layer on the top as a hard mask.

4. The method for fabricating the FinFET of claim 1, wherein, in step 4), an etch-back depth of the STI isolation layer around the silicon mesa of the drain and source regions is 100 Å-2000 Å.

5. The method for fabricating the FinFET of claim 1, wherein, in step 5), SiGe material is epitaxially grown on the drain and source of a P-type transistor; and Si or SiC material is epitaxially grown on the drain and source of a N-type transistor.

6. The method for fabricating the FinFET of claim 1, wherein, an epitaxy thickness in a direction of a fin width does not exceed ⅓ of a spacing distance of two fins adjacent to each other in an integrated circuit.

7. The method for fabricating the FinFET of claim 1, wherein, step 6) comprising, depositing a silicon oxide through a high density plasma chemical vapor deposition process to cover the entire surface of silicon wafer, and then performing a thinning, planarization, and etch-back process.

8. The method for fabricating the FinFET of claim 1, wherein, in step 7), the dummy gate is removed by performing a dry etching process firstly and then removing the dummy gate completely through a wet etching process.

9. The method for fabricating the FinFET of claim 1, wherein, in step 7), the STI isolation layer under the dummy gate is etch-backed, with a depth of 100 Å-2500 Å.

10. The method for fabricating the FinFET of claim 1, wherein, step 8) comprising, depositing a high-K dielectric and metal gate electrode, and performing a thinning and planarization process to the metal gate through a chemical mechanical polishing process till the silicon nitride layer is exposed, thereby obtaining a 3-dimensional triple gate FinFET device.

11. The method of fabricating the FinFet of claim 2, wherein, step 2) includes: depositing a thin layer of silicon oxide on an exposed surface of the active region as the sacrificial gate oxide layer by an atomic layer deposition (ALD) process, then depositing a layer of polysilicon or amorphous silicon on the sacrificial gate oxide layer as a dummy gate material, and sequentially depositing a silicon oxide layer and a silicon nitride layer as a hard mask; then performing a photolithography process for the gate pattern with the photoresist as a mask to etch the silicon nitride layer on the top; and, removing the photoresist and performing a dry etching to the silicon oxide layer and the dummy gate till the sacrificial gate oxide layer is exposed with an patterned silicon nitride layer on the top as a hard mask.

12. The method of fabricating the FinFet of claim 2, wherein, in step 4), an etch-back depth of the STI isolation layer around the silicon mesa of the drain and source regions is about 100 Å to about 2000 Å.

13. The method for fabricating the FinFET of claim 2, wherein, in step 5), SiGe material is epitaxially grown on the drain and source of a P-type transistor; and Si or SiC material is epitaxially grown on the drain and source of a N-type transistor.

14. The method for fabricating the FinFET of claim 3 wherein, in step 4), an etch-back depth of the STI isolation layer around the silicon mesa of the drain and source regions is about 100 Å to about 2000 Å.

15. The method for fabricating the FinFET of claim 4, wherein, in step 5), SiGe material is epitaxially grown on the drain and source of a P-type transistor; and Si or SiC material is epitaxially grown on the drain and source of a N-type transistor.

16. The method for fabricating the FinFET of claim 4, wherein, an epitaxy thickness in a direction of a fin width does not exceed about ⅓ of a spacing distance of two fins adjacent to each other in an integrated circuit.

17. The method for fabricating the FinFET of claim 4, wherein, step 6) comprising, depositing a silicon oxide through a high density plasma chemical vapor deposition process to cover the entire surface of silicon wafer, and then performing a thinning, planarization, and etch-back process.

18. The method for fabricating the FinFET of claim 4, wherein, in step 7), the dummy gate is removed by performing a dry etching process firstly and then removing the dummy gate completely through a wet etching process.

19. The method for fabricating the FinFET of claim 4, wherein, in step 7), the STI isolation layer under the dummy gate is etch-backed, with a depth of about 100 Å to about 2500 Å.

20. The method for fabricating the FinFET of claim 4, wherein, step 8) comprising, depositing a high-K dielectric and metal gate electrode, and performing a thinning and planarization process to the metal gate through a chemical mechanical polishing process till the silicon nitride layer is exposed, thereby obtaining a 3-dimensional triple gate FinFET device.

* * * * *